(12) United States Patent
Inazuki et al.

(10) Patent No.: US 8,168,351 B2
(45) Date of Patent: May 1, 2012

(54) METHOD FOR INSPECTING PHOTOMASK BLANK OR INTERMEDIATE THEREOF, METHOD FOR DETERMINING DOSAGE OF HIGH-ENERGY RADIATION, AND METHOD FOR MANUFACTURING PHOTOMASK BLANK

(75) Inventors: Yukio Inazuki, Joetsu (JP); Hideo Kaneko, Joetsu (JP); Hiroki Yoshikawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 227 days.

(21) Appl. No.: 12/750,121

(22) Filed: Mar. 30, 2010

(65) Prior Publication Data

US 2010/0248091 A1 Sep. 30, 2010

(30) Foreign Application Priority Data

Mar. 31, 2009 (JP) ................................. 2009-086185

(51) Int. Cl.
*G03F 1/00* (2012.01)
*G06K 9/00* (2006.01)
(52) U.S. Cl. .......................................... 430/5; 382/144
(58) Field of Classification Search ................ 430/5, 30, 430/322; 382/144
See application file for complete search history.

(56) References Cited

U.S. PATENT DOCUMENTS

| 5,830,607 | A | 11/1998 | Isao et al. | |
|---|---|---|---|---|
| 6,746,806 | B2 | 6/2004 | Nozawa | |
| 7,195,846 | B2 * | 3/2007 | Kaneko et al. | 430/5 |
| 2002/0068228 | A1 * | 6/2002 | Kureishi et al. | 430/5 |
| 2004/0253524 | A1 | 12/2004 | Itoh | |
| 2005/0260505 | A1 | 11/2005 | Fukushima et al. | |
| 2007/0212618 | A1 | 9/2007 | Yoshikawa et al. | |
| 2007/0212619 | A1 | 9/2007 | Yoshikawa et al. | |
| 2009/0035880 | A1 | 2/2009 | Itoh | |

FOREIGN PATENT DOCUMENTS

| EP | 1 832 926 A2 | 9/2007 |
|---|---|---|
| JP | 7-140635 A | 6/1995 |
| JP | 2002-229183 A | 8/2002 |
| JP | 2003-50458 A | 2/2003 |
| JP | 2004-199035 A | 7/2004 |
| JP | 2005-331554 A | 12/2005 |
| JP | 2007-241060 A | 9/2007 |
| JP | 2007-241065 A | 9/2007 |

OTHER PUBLICATIONS

Borodovsky, "Marching to the beat of Moore's Law", Proc. of SPIE vol. 6153 615301-19, (2006).
Extended European Search Report dated Jul. 25, 2011 for European Application No. 10250649.0.

* cited by examiner

*Primary Examiner* — Stephen Rosasco
(74) *Attorney, Agent, or Firm* — Birch, Stewart, Kolasch & Birch, LLP

(57) ABSTRACT

A photomask blank which is manufactured by depositing a phase shift film on a substrate and irradiating the phase shift film with high-energy radiation to effect substrate shape adjusting treatment is inspected by measuring a surface topography of the photomask blank after the substrate shape adjusting treatment, removing the phase shift film from the photomask blank, measuring a surface topography of the treated substrate after removal of the phase shift film, and comparing the surface topographies, thereby evaluating a warpage change before and after removal of the phase shift film, due to a stress of the phase shift film having undergone substrate shape adjusting treatment.

5 Claims, 1 Drawing Sheet

METHOD FOR INSPECTING PHOTOMASK BLANK OR INTERMEDIATE THEREOF, METHOD FOR DETERMINING DOSAGE OF HIGH-ENERGY RADIATION, AND METHOD FOR MANUFACTURING PHOTOMASK BLANK

CROSS-REFERENCE TO RELATED APPLICATION

This non-provisional application claims priority under 35 U.S.C. §119(a) on Patent Application No. 2009-086185 filed in Japan on Mar. 31, 2009, the entire contents of which are hereby incorporated by reference.

TECHNICAL FIELD

This invention relates to a method for inspecting photomask blanks or intermediates thereof from which are produced photomasks for use in the lithographic manufacture of semiconductor integrated circuits, charge-coupled devices (CDD), liquid crystal display (LCD) color filters, magnetic heads or the like; a method for determining a dosage of high-energy radiation in the manufacture of photomask blanks; and a method for manufacturing photomask blanks.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, the manufacture of circuit pattern-written photomasks for use in the photolithography for forming such wiring patterns and contact hole patterns needs a technique capable of accurately writing finer circuit patterns in order to meet the miniaturization demand.

In forming a finer feature pattern, a resist film is exposed to a pattern of radiation using a photomask and an optical system. If the photomask undergoes any unexpected shape change at this point, the positional accuracy of the resultant image is reduced, resulting in defective patterns. To overcome the problem, the shape of a photomask substrate must be controlled as reported in JP-A 2003-50458. It is reported that use of a substrate having a specific surface topography as the photomask substrate suppresses any change of surface topography when the photomask is chucked to the mask stage of the exposure tool.

In the prior art, the flatness of photomask-forming transparent substrates and photomask blanks is regarded important. When an optical film such as a light-shielding film or phase shift film is deposited on a photomask-forming transparent substrate, the stress in the optical film is controlled so that the substrate shape may not be changed. Many techniques for controlling "sori" (warpage or bow), that is, shape change of the substrate surface are known, as described in JP-A 2004-199035 and JP-A 2002-229183.

Aside from the problem of substrate shape, the size control of a pattern of optical film such as a semiconductor circuitry pattern written on a photomask is also a problem. A higher degree of control is required as the desired pattern feature size is reduced. For example, in the manufacture of a photomask for use in producing a pattern having the minimum line width of up to 65 nm, especially up to 50 nm, a light-shielding film of chromium base material used in the prior art is difficult to control side etching during the etching step. Then the finish size may widely vary with a different density of a pattern to be written, known as the pattern density dependency or "proximity bias". JP-A 2007-241060 describes that the problem of proximity bias can be mitigated by forming the light-shielding film from an optionally transition metal-containing silicon base material and that the light-shielding film is processed using a very thin chromium base material as an etching mask. It is described that using an optionally transition metal-containing silicon base material as the etching mask, a photomask which is size controlled at a very high accuracy can be manufactured.

The photomask for use in the lithography wherein a semiconductor circuit pattern has a minimum size of up to 45 nm requires a high degree of size control. When such a photomask is prepared using an optionally transition metal-containing silicon base material as the light-shielding film and a chromium base material as the etching mask film, the size control has little latitude.

In the manufacture of photomasks used in the lithography for forming a pattern having a minimum size of up to 45 nm, especially the lithography of which a higher accuracy of positional control is required as in the case of double patterning (Proceedings of SPIE, Vol. 6153, 615301-1 to 19 (2006)), the yield of photomask manufacture cannot be increased unless a reliability surpassing the currently available accuracy is provided.

CITATION LIST

| | |
|---|---|
| Patent Document 1: | JP-A 2003-050458 |
| Patent Document 2: | JP-A 2004-199035 |
| Patent Document 3: | JP-A 2007-241060 |
| | (US 2007/212619, EP 1832926A2) |
| Patent Document 4: | JP-A H07-140635 |
| Patent Document 5: | JP-A 2007-241065 |
| Patent Document 6: | JP-A 2002-229183 |
| Non-Patent Document 1: | Proceedings of SPIE, Vol. 6153, 615301-1 to 19 (2006) |

SUMMARY OF INVENTION

An object of the invention is to provide a method for inspecting a photomask blank or intermediate thereof having a phase shift film and requiring a high accuracy of processing, for evaluating a stress in the phase shift film that induces a change of surface topography which can cause dimensional errors upon processing of the photomask blank; a method for determining a dosage of high-energy radiation in the manufacture of photomask blanks; and a method for manufacturing photomask blanks.

As discussed above, an appropriate shape control method is necessary for a photomask or photomask blank so that the photomask may not incur a degraded depth of focus on use. It has been a practice to use a less stressed film as the optical film such as a light-shielding film or phase shift film to avoid that the photomask-forming substrate undergoes a shape change before and after deposition of the optical film so that the photomask becomes unusable (see, for example, JP-A 2004-199035 and JP-A 2002-229183).

Making extensive investigations on a shape change which a photomask substrate may undergo during processing of a photomask blank into a photomask and which can cause an error in pattern position, the inventors have found that a phase shift film which is handled as having low stress in the prior art can sometimes have an unexpectedly high stress.

Generally the phase shift film has a noticeable compression stress immediately after deposition since it is formed of a material having a relatively high oxygen and/or nitrogen content. Thus, adjustment of the substrate shape is generally carried out by applying high-energy radiation or the like to the phase shift film to mitigate the stress. In the prior art, the substrate shape adjusting treatment is carried out such that the substrate shape prior to film deposition is resumed by application of high energy. Therefore, the standard on which the stress is regarded zero (0) is the surface topography of the substrate prior to film deposition. The inventors have found that even in the case of a photomask blank having a phase shift film which is considered as substantially free of stress on this standard, a change of its surface topography still occurs when it is etched, and that on a strict evaluation, a lowering of position accuracy is concomitant with the processing.

To improve the reliability with respect to the position and dimensions of a photomask which is fabricated from a photomask blank, the position of the phase shift pattern the completed photomask possesses must be spatially commensurate with the position of a resist pattern formed for processing of the phase shift film or substantially commensurate with the position of a resist pattern formed for processing of the phase shift film so as to be compliant with the required accuracy. As used herein, the term "spatial commensuration" does not refer to the relative position on the surface of the photomask blank, but refers to positional commensuration including a spatial movement of the surface by a change of surface topography of the substrate or the film deposited thereon resulting from relief of film stress. If the substrate shape changes as a result of relief of film stress that can occur during etching of the phase shift film, then a position shift occurs.

In order to produce a photomask blank with higher reliability, the stress that the phase shift film possesses must be inspected in a correct way. The inventors have found that by removing the phase shift film having undergone substrate shape adjusting treatment after its deposition, measuring a surface topography before and after removal of the phase shift film, and comparing the surface topographies, it is possible to determine a warpage change, from which the film stress is evaluated.

Once the film stress is evaluated by the above method, it is possible to speculate how the film stress is actually left after the substrate shape adjusting treatment which is carried out to mitigate the film stress. An appropriate dosage of high-energy radiation that provides a phase shift film having a reduced stress after the substrate shape adjusting treatment can be determined. By irradiation of high-energy radiation, the film stress can be mitigated such that a change of warpage before and after processing of the phase shift film may be minimized.

Further, when the above inspection method is applied to a photomask blank or intermediate thereof which is manufactured by a specific manufacture process and has a phase shift film deposited on a substrate, the maximum warpage change that the substrate can undergo due to relief of film stress after processing can be speculated. From the inspection results based on the preselected reliability threshold, the photomask blank or intermediate thereof manufactured by said process is given a high reliability with respect to dimensional accuracy errors. The present invention is predicated on these findings.

Accordingly, the invention provides a method for inspecting a photomask blank or intermediate thereof, a method for determining a dosage of high-energy radiation for substrate shape adjustment, and a method for manufacturing a photomask blank.

[1] A method for inspecting a photomask blank or an intermediate thereof which is manufactured by depositing a phase shift film on a photomask-forming substrate and irradiating the phase shift film with high-energy radiation to effect substrate shape adjusting treatment, the method comprising the steps of:
  measuring a surface topography of the photomask blank or intermediate after the substrate shape adjusting treatment,
  removing the phase shift film from the photomask blank or intermediate,
  measuring a surface topography of the treated substrate after removal of the phase shift film, and
  comparing the surface topography of the photomask blank or intermediate with the surface topography of the treated substrate, thereby evaluating a warpage change before and after removal of the phase shift film, due to a stress of the phase shift film having undergone substrate shape adjusting treatment.

[2] The method of [1] wherein the high-energy radiation is emission of a flash lamp.

[3] A method for inspecting a plurality of photomask blanks or intermediates thereof, each said photomask blank or intermediate thereof comprising a photomask-forming substrate and a phase shift film deposited thereon and subjected to substrate shape adjusting treatment by irradiation of high-energy radiation, the method comprising the steps of:
  manufacturing a plurality of photomask blanks or intermediates by depositing a phase shift film on a photomask-forming substrate under predetermined conditions and effecting substrate shape adjusting treatment under predetermined conditions,
  taking a sample photomask blank or intermediate out of the plurality of photomask blanks or intermediates, evaluating a warpage change of the sample photomask blank or intermediate before and after removal of the phase shift film, due to a stress of the phase shift film having undergone substrate shape adjusting treatment, in accordance with the inspection method of [1] or [2], and
  judging the plurality of photomask blanks or intermediates to be acceptable or unacceptable based on the warpage change thus evaluated.

[4] In connection with a photomask blank or an intermediate thereof which is manufactured by depositing a phase shift film on a photomask-forming substrate and irradiating the phase shift film with high-energy radiation to effect substrate shape adjusting treatment,
  a method for determining a dosage of high-energy radiation for substrate shape adjusting treatment, comprising the steps of:
  preparing two or more photomask blanks or intermediates by depositing a phase shift film on a substrate under predetermined conditions and irradiating the phase shift film with different dosages of high-energy radiation,
  evaluating a warpage change of each photomask blank or intermediate before and after removal of the phase shift film, due to a stress of the phase shift film having undergone substrate shape adjusting treatment, in accordance with the inspection method of [1] or [2], and
  comparing the warpage changes of the two or more photomask blanks or intermediates, thereby determining the dosage of high-energy radiation that provides a less warpage change.

[5] A method for manufacturing a photomask blank, comprising the steps of depositing a phase shift film on a photomask-forming substrate and irradiating the phase shift film with high-energy radiation to effect substrate shape adjusting treatment, the substrate shape adjusting treatment being effected by irradiating the phase shift film with high-energy radiation in a dosage that is determined by the method of [4].

ADVANTAGEOUS EFFECTS OF INVENTION

The method of the invention is capable of more accurately evaluating the stress applied to the substrate by the phase shift film after substrate shape adjusting treatment. This in turn enables to determine an appropriate dosage of high-energy radiation to mitigate the stress in the manufacture of a photomask blank from which a photomask for use in the lithography to a pattern rule of 45 nm or less is fabricated.

When a photomask blank or intermediate thereof having a phase shift film is inspected by the inspection method, the stress that the phase shift film of the photomask blank or intermediate manufactured by the specific manufacture process possesses can be speculated more accurately. This improves the reliability with respect to dimensional control when the photomask blank or intermediate manufactured by the specific manufacture process is processed into a photomask.

DESCRIPTION OF EMBODIMENTS

Figure 1A:
FIG. 1 illustrates, for a photomask blank or intermediate having a phase shift film deposited on a substrate and the treated substrate after removal of the phase shift film, how to evaluate a change of surface topography before and after removal of the phase shift film.

Photomasks for use in the photolithography for printing a pattern size of up to 65 nm, especially up to 45 nm, especially photomasks for use in the double patterning version of photolithography are required to have a very high mask accuracy. Accordingly, the processing of photomask blanks is also required to have a very high processing accuracy.

It is described in JP-A 2003-50458 that as to the photomask used in microprocessing, there was already a need for a transparent substrate having a specific shape which does not undergo a shape change when the photomask is chucked and mounted in an exposure tool. Once a low stressed optical film is deposited on such a photomask-forming transparent substrate having a specific shape to construct a photomask blank, the optical film is etched to fabricate a photomask, ensuring the production yield of photomasks. In the field of phase shift film, a phase shift film which gives a surface topography closely conformal to the surface topography of a substrate prior to film deposition has been sought for as the low-stressed phase shift film.

In general, a metal compound film or silicon compound film imparts a compression stress to a photomask-forming substrate when it has high contents of light elements such as oxygen, nitrogen and carbon. Since the phase shift film is required to have a certain degree of transmission of exposure light independent of whether it consists of a single layer or multiple layers, a material giving high contents of light elements as an overall film is used. Thus the phase shift film deposited by sputtering tends to have a relatively high compression stress although the stress varies with sputtering conditions.

With respect to photomask blanks used in the fabrication of phase shift masks for use in the lithography based on a pattern rule of less than 100 nm as required by the state-of-the-art technology, it is preferred to make a correction for deformation of the substrate caused by the stress that the phase shift film possesses immediately after deposition. A number of proposals have been made on the treatment for reducing the stress. The actually effective proposal is a method of removing stress by letting the phase shift film to absorb energy without applying substantial energy to the photomask substrate. In particular, the method of applying energy to the phase shift film from a flash lamp for a very short time is effective (see JP-A 2004-199035).

Attempting to increase the accuracy of a photomask blank that ensures a processing accuracy applicable to the fabrication of photomasks for use in the photolithography for printing a pattern size of up to 45 nm, especially photomasks for use in the double patterning version of photolithography, the inventors have found that a problem arises when a film containing molybdenum, silicon, oxygen and nitrogen is deposited on a photomask-forming substrate to manufacture a halftone phase shift mask blank, the blank is subjected to light irradiation under a xenon flash lamp as the high-energy radiation (JP-A 2004-199035) so that the surface topography (warpage) of the original substrate is resumed, and the halftone phase shift film is removed by dry etching. The problem is that in a stricter evaluation, the surface topography differs before and after the removal of the phase shift film.

If the substrate is subject to such a deformation or a change of warpage, an error in pattern position is introduced upon fabrication of a photomask from the photomask blank.

In pattern processing, the lithography is carried out using a resist pattern which protects the region where the phase shift film pattern is to be left, with or without interposing an intermediate film such as a light-shielding film. Specifically a resist pattern is formed by patternwise irradiation of electron beam, for example. Then, using the resultant resist pattern and optionally an intermediate film such as an etching mask film or light-shielding film as an etching mask, an unnecessary portion of the phase shift film is removed by etching. Particularly in the case of a phase shift mask having a bright pattern (i.e., pattern with a less area of remaining phase shift film), a more fraction of phase shift film is removed. If the phase shift film has a stress capable of deforming the substrate, then a drastic change of the substrate shape occurs. If such a change of the substrate shape occurs, the position where the resist is formed on the photomask blank and the position of the phase shift pattern in the stage of completed phase shift mask are identical when viewed on the basis coordinates along the substrate surface. But, assuming a coordinate system wherein three-dimensional absolute coordinates are set in a space, for example, wherein coordinates are set so that the center point of the substrate surface is the origin, and a least square plane of the substrate surface is parallel to X-Y plane, if a change of warpage (sori) occurs, then point A on the substrate surface with coordinates ($a_x$, $a_y$, $a_z$) exclusive of $a_x=a_y\neq0$ is displaced not only in Z axis direction, but also in X and/or Y axis direction.

In the case of a photomask to be used in the nearly commercially available photolithography for forming a resist pattern having a pattern rule of up to 50 nm, for example, a typical photomask of 152 mm square, if the pattern position at the stage of photomask completion is shifted from the designed position, i.e., the position of EB irradiation to photoresist by 100 nm at the point of maximum displacement in Z axis direction of the three-dimensional coordinate system, then the photomask is no longer regarded as reliable. The positional displacement should preferably be up to 50 nm.

To ensure that photomask blanks are reliable with respect to deformation during processing, the invention takes the following procedure rather than confirming that the surface topography of a substrate having a phase shift film deposited thereon is converted, by substrate shape adjusting treatment, back to the surface topography of a substrate prior to film deposition. After deposition of a phase shift film and substrate shape adjustment by application of high-energy radiation, inspection is carried out by removing the phase shift film by etching and confirming that a change of surface topography before and after film removal does not exceed the required level.

According to the invention, a photomask blank or an intermediate thereof which is manufactured by depositing a phase shift film on a photomask-forming substrate and irradiating the phase shift film with high-energy radiation to effect substrate shape adjusting treatment is inspected by measuring a surface topography of the photomask blank or intermediate after the substrate shape adjusting treatment, removing the phase shift film from the photomask blank or intermediate, measuring a surface topography of the treated substrate after removal of the phase shift film, and comparing the surface topography of the photomask blank or intermediate with the surface topography of the treated substrate, thereby evaluating a warpage change before and after removal of the phase shift film, due to a stress of the phase shift film having undergone substrate shape adjusting treatment.

Photomask-forming substrates (photomask blank-forming substrates) used herein may be rectangular, and specifically square. Use may be made of conventional well-known substrates which are transparent to exposure light, such as synthetic quartz substrates. The preferred substrate is a photomask-forming substrate having a specific shape that undergoes no deformation when the photomask is chucked to the exposure tool as reported in JP-A 2003-50458.

As to the phase shift film, typically halftone phase shift film, a number of examples are known. In general, the phase shift film consists of a single layer, multiple layers, or a compositionally graded layer. The material of which the phase shift film is made is typically a silicon material having a light element such as oxygen or nitrogen added thereto and optionally containing a transition metal such as Mo, Zr, Ti, Ta, W or Nb (e.g., JP-A H07-140635). A layer of a transition metal such as Cr or a layer of a transition metal having a light element such as oxygen or nitrogen added thereto may be included as one constituent layer in the phase shift film.

In the embodiment wherein the phase shift film is a halftone phase shift film, the halftone phase shift film may consist of a single layer, multiple layers, or a compositionally graded layer. The halftone phase shift film may be made of an optionally transition metal-containing silicon material. It is specifically a transition metal-silicon alloy or a transition metal silicon compound containing a transition metal, silicon, and at least one element selected from oxygen, nitrogen and carbon, preferably a transition metal silicon compound containing a transition metal, silicon, and oxygen and/or nitrogen. Examples of the transition metal silicon compound include a transition metal silicon oxide, transition metal silicon nitride, transition metal silicon oxynitride, transition metal silicon oxycarbide, transition metal silicon nitride carbide, and transition metal silicon oxide nitride carbide. The transition metal used herein is preferably at least one of titanium, vanadium, cobalt, nickel, zirconium, niobium, molybdenum, hafnium, tantalum and tungsten, with molybdenum being more preferred for ease of dry etching. The optionally transition metal-containing silicon material may preferably be composed of 10 atom % to 95 atom % of silicon, 0 atom % to 60 atom % of oxygen, 0 atom % to 57 atom % of nitrogen, 0 atom % to 20 atom % of carbon, and 0 atom % to 35 atom %, especially 1 atom % to 20 atom % of a transition metal. The material may be selected from the composition range, depending on the film construction (single layer or multiple layers) and film thickness, so as to provide the desired transmittance and phase shift.

As described above, the phase shift film is typically a film having a certain compression stress at the as-deposited-stage since substantial amounts of light elements are contained when the overall film is considered. If a phase shift film itself has a noticeable compression stress, there is a high possibility that the inspection of the surface topography may display failure due to a substantial change of substrate shape before and after removal of the phase shift film because the stress is relieved upon removal of the phase shift film. Then, it may be necessary to provide stress relief. As the stress relieving treatment, use of high-energy radiation is most effective (e.g., JP-A 2004-199035). The high-energy radiation may be any of infrared radiation, visible light, ultraviolet radiation, and the like. A means capable of imparting a necessary amount of energy to an object within a short duration of up to 1 second is preferred in order to minimize the damage to the substrate. It is preferred to irradiate high-energy radiation of 150 to 800 nm wavelength as the effective energy for a short duration because the energy absorption of and the damage to the photomask-forming substrate are minimized.

The most preferred method is energy irradiation from a flash lamp as described above. Of the flash lamps, a xenon flash lamp is well known. Most often, a xenon flash lamp is used which may be filled with argon or hydrogen.

Use of the flash lamp is highly effective for film quality improvement because a high dosage of energy (e.g., of 0.1 to 100 J/cm$^2$) can be applied to the film by a single emission for a very short duration (e.g., of 0.0001 to 1 sec). Although similar effects are achieved with a pulsed laser such as excimer laser, the flash lamp has advantages including a wide range of application due to its broad spectrum and a high energy efficiency. Since the flash lamp produces a very large quantity of light, a single emission can apply energy to the entire surface of a substrate.

In one embodiment wherein a flash lamp is used in substrate shape adjustment for modifying the stress of the phase shift film, it is preferred to irradiate light from the flash lamp in an energy density of 0.5 to 100 J/cm$^2$. The duration of a single emission from the flash lamp is preferably 0.1 to 100 msec. The number of irradiation may be single or divided in several times.

From the substrate which has undergone substrate shape adjusting treatment, the phase shift film is removed to allow for inspection of the stress of the phase shift film. Film removal may be achieved by a technique similar to the etching technique used in etching of the phase shift film for processing into a photomask. In an example wherein the film is of an optionally transition metal-containing silicon material, dry etching with fluorine base etchant gas is preferably used.

The inspection to determine a stress of the phase shift film, i.e., a warpage change from a comparison of the measured surface topography prior to removal of the phase shift film with the measured surface topography after removal of the phase shift film may be performed by the following procedure.

For example, using a surface analysis device or surface topography measuring device capable of optically scanning a topography of a surface (a surface of transparent substrate, a surface of a film deposited (i.e., a surface of photomask blank or intermediate), or a surface of a treated transparent substrate or film exposed after removal of the phase shift film), a surface topography of the photomask blank or intermediate prior to removal of the phase shift film is measured to deliver data of measurement. Next, the phase shift film is removed, and a surface topography after film removal is measured to deliver data of measurement. The difference between these two surface topographies may be evaluated as a warpage change. The warpage change may be determined by any method which can rationally define a quantity of warpage change. The reference value below which a blank is judged pass (acceptable) may be set in accordance with the desired mask accuracy. For example, the photomask blank or intermediate may be judged on a pass/fail basis by comparing the surface topographies in the following way.

Subject to analysis are the outermost surface of a photomask blank or intermediate prior to removal of the phase shift film and the outermost surface of a treated substrate after removal of the entire phase shift film from the photomask blank or intermediate.

(1) The outermost surfaces are measured by the surface topography measuring device, obtaining XYZ three-dimensional coordinate data of each outermost surface.

(2) From the coordinate data of each outermost surface, a least square plane of that outermost surface is computed.

(3) While the relative position between the coordinates of the outermost surface of the photomask blank or intermediate and the least square plane thereof, and the relative position between the coordinates of the outermost surface of the treated substrate and the least square plane thereof are fixed, the coordinates and the least square plane are arranged such that (i) two least square planes are positioned on XY plane of a XYZ three-dimensional imaginary space, (ii) both the center of an outermost equivalent region of the photomask blank or intermediate providing the former least square plane and the center of an outermost equivalent region of the treated substrate providing the latter least square plane are positioned at the origin, and (iii) the two outermost equivalent regions are arranged in overlay with their diagonal directions in alignment so that the four corners of the two outermost equivalent regions correspond to each other, respectively, before and after removal of the phase shift film.

(4) Within the range of the coordinate data arranged as above, for each pair of coordinates between the coordinates of the outermost surface of the photomask blank or intermediate and the coordinates of the outermost surface of the treated substrate that are commensurate in X and Y values, the difference ($Z_1-Z_2$) between a Z value ($Z_1$) of the outermost surface of the photomask blank or intermediate and a Z value ($Z_2$) of the outermost surface of the treated substrate is computed.

(5) A sum of the magnitude of maximum and the magnitude of minimum of the difference ($Z_1-Z_2$) of Z values is determined, that represents a warpage change.

More specifically, the surface topography of the outermost surface of the photomask blank or intermediate prior to removal of the phase shift film (i.e., the surface of the phase shift film) is measured by a surface topography measuring device using an optical system. The device delivers XYZ three-dimensional coordinate data of the outermost surface to create a surface map, from which a least square plane is computed. Next, the entire phase shift film is removed typically under the stripping conditions used in its processing. The surface topography of the outermost surface of the treated substrate after removal of the phase shift film (i.e., the surface of a film disposed contiguous to the phase shift film, if any, or transparent substrate) is similarly measured. The device delivers XYZ three-dimensional coordinate data of that outermost surface to create a surface map, from which a least square plane is computed.

Next, using a suitable unit, typically a computer, the coordinates and the least square planes thus obtained are arranged in an imaginary space so as to meet all the following conditions (i) to (iii), while the relative position between the coordinates of the outermost surface of the photomask blank or intermediate and the least square plane thereof, and the relative position between the coordinates of the outermost surface of the treated substrate and the least square plane thereof are fixed (i.e., the coordinates of the outermost surface and the least square plane providing them are integrated).

(i) Two least square planes are positioned on XY plane of a XYZ three-dimensional imaginary space.

(ii) Both the center of an outermost equivalent region of the photomask blank or intermediate providing the former least square plane and the center of an outermost equivalent region of the treated substrate providing the latter least square plane are positioned at the origin.

(iii) The two outermost equivalent regions are arranged in overlay with their diagonal directions in alignment so that the four corners of the two outermost equivalent regions correspond to each other, respectively, before and after removal of the phase shift film.

Figure 1B:
Figure 1C:
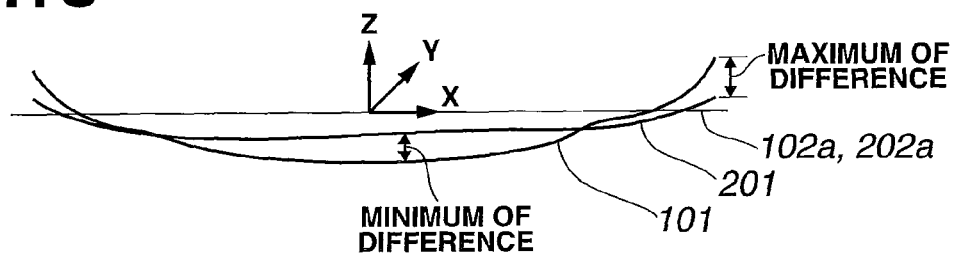

The foregoing procedure is described with reference to FIG. 1. A coordinate group 101 of the outermost surface of a photomask blank or intermediate and a least square plane 102 thereof as shown in FIG. 1A, and a coordinate group 201 of the outermost surface of a treated substrate and a least square plane 202 thereof as shown in FIG. 1B are arranged in a XYZ three-dimensional imaginary space as shown in FIG. 1C. The least square planes 102 and 202 are arranged on XY plane, so that both the planes are positioned in a common plane. Both an outermost equivalent region 102a of the photomask blank or intermediate providing least square plane 102 and an outermost equivalent region 202a of the treated substrate providing the least square plane 202 are arranged such that their centers are positioned at the origin of XYZ coordinates. That is, least square planes 102 and 202 are arranged in XY plane with Z=0. Further the two outermost equivalent regions are arranged with their diagonal directions in alignment so that four corners of the outermost equivalent region 102a correspond to four corners of the outermost equivalent region 202a, respectively, (one corner corresponds to relevant one corner) before and after removal of the phase shift film.

Next, as shown in FIG. 1C, within the range of the coordinate data arranged as above, for each pair of coordinates between the coordinates of the outermost surface of the photomask blank or intermediate and the coordinates of the outermost surface of the treated substrate that are commensurate in X and Y values, the difference ($Z_1-Z_2$) between a Z value ($Z_1$) of the outermost surface of the photomask blank or intermediate and a Z value ($Z_2$) of the outermost surface of the treated substrate is computed. The value of difference ($Z_1-Z_2$) is positive (+) if $Z_1>Z_2$, and negative (−) if $Z_1<Z_2$.

A sum of the magnitude (absolute value) of maximum and the magnitude of minimum of the difference ($Z_1-Z_2$) of Z values represents a warpage change.

For a photomask blank or intermediate of 152 mm (6 inches) square, a warpage change of up to 50 nm indicates a processing accuracy with a latitude enough to be used in the double patterning version of lithography to form a pattern with a minimum line width of about 25 nm.

For photomask blanks or intermediates of different dimensions, a permissible warpage change is in proportion to the dimensions. As long as the warpage change is up to 50 nm/L/152 mm wherein L is the length (in mm) of a longer side of a transparent substrate, a high processing accuracy is available.

Briefly stated, coordinate data are applicable to both the outermost surface of a photomask blank and the outermost surface of a treated substrate, from which a least square plane of the surface may be computed in a simplified way. Three or more points are set on a circle having a radius R (mm) about the center of each outermost surface. Least square planes are computed from the coordinates of the three or more points and the centers. Thereafter, a warpage change may be similarly evaluated. For a photomask blank which is processed into a photomask for use in the double patterning version of lithography to form a pattern with a minimum line width of about 25 nm, the photomask blank is judged pass (acceptable) when the standard warpage change is cleared. If the value of warpage change is less than or equal to:

$$50 \text{ (nm)}/2R/(152 \text{ (mm)} \times \sqrt{2})$$

then the photomask blank is reliable enough to insure a photomask having a high positional accuracy.

The inspection method of the invention is effective for the inspection of products in a lot and the optimization of manufacturing conditions during the process of manufacturing photomask blanks.

One embodiment is a method for inspecting a lot of photomask blanks or intermediates thereof, each said photomask blank or intermediate thereof comprising a photomask-forming substrate and a phase shift film deposited thereon and subjected to substrate shape adjusting treatment by irradiation of high-energy radiation, the method comprising the steps of manufacturing a plurality of photomask blanks or intermediates by depositing a phase shift film on a photomask-forming substrate under predetermined conditions and effecting substrate shape adjusting treatment under predetermined conditions; taking a sample photomask blank or intermediate out of the plurality of photomask blanks or intermediates, evaluating a warpage change of the sample photomask blank or intermediate before and after removal of the phase shift film, due to a stress of the phase shift film having undergone substrate shape adjusting treatment, in accordance with the inspection method of the invention; and judging the plurality of photomask blanks or intermediates to be acceptable or unacceptable based on the warpage change thus evaluated.

Provided that a photomask blank or an intermediate thereof is manufactured by depositing a phase shift film on a photomask-forming substrate and irradiating the phase shift film with high-energy radiation to effect substrate shape adjusting treatment, another embodiment provides a method for determining a dosage of high-energy radiation for substrate shape adjusting treatment, comprising the steps of preparing two or more photomask blanks or intermediates by depositing a phase shift film on a substrate under predetermined conditions and irradiating the phase shift film with different dosages of high-energy radiation, evaluating a warpage change of each photomask blank or intermediate before and after removal of the phase shift film, due to a stress of the phase shift film having undergone substrate shape adjusting treatment, in accordance with the inspection method of the invention, and comparing the warpage changes of the two or more photomask blanks or intermediates, thereby determining the dosage of high-energy radiation that provides a less warpage change. In a preferred embodiment, a photomask blank may be manufactured by depositing a phase shift film on a photomask-forming substrate and irradiating the phase shift film with high-energy radiation in a dosage that is determined by the above method, to effect substrate shape adjusting treatment.

In order to produce a substrate having a phase shift film with a minimal stress so that the substrate may experience a minimal change of warpage after removal of the phase shift film, while resorting to irradiation of high-energy radiation, it is preferred to irradiate high-energy radiation in an optimum dosage. In a closed interval around the preferred dosage, the relationship of the dosage of radiation to the warpage change may take linear approximation.

Accordingly, the dosage of high-energy radiation that is necessary to reduce to zero (0) the stress of a phase shift film deposited on a substrate under particular manufacturing conditions may be estimated by irradiating phase shift films with high-energy radiation in at least two different dosages, removing the phase shift films from the substrates, determining warpage changes, and taking linear approximation between the warpage changes and the dosages. Using the method of estimating the optimum dosage of high-energy radiation, a photomask blank or intermediate thereof having a phase shift film whose true stress is reduced to nearly zero may be readily manufactured.

EXAMPLE

Examples of the invention are given below by way of illustration and not by way of limitation.

Example 1

Preparation of Photomask Blank Having Halftone Phase Shift Film

Four synthetic quartz photomask substrates of 152 mm square were prepared. By a sputtering technique using MoSi and Si targets and a mixture of nitrogen, oxygen and argon gases as the sputtering gas, a halftone phase shift film of MoSiON (Mo:Si:O:N=1:4:1:4 atomic ratio) having a thickness of 76 nm was deposited on each substrate.

Shape Adjustment

Using a xenon flash lamp having a pulse length of 0.1 to 10 msec, the four photomask blanks having the MoSiON film deposited thereon were irradiated in four different energy dosages. The energy dosage is expressed by a standardized value, provided that the energy dosage produced upon application of 3175 volts is unity (1).

Comparison of Surface Topography after Substrate Shape Adjustment

The surface topography of the substrate prior to phase shift film deposition and the surface topography of the photomask blank having high energy imparted for shape adjustment were compared in terms of a warpage change ($\Delta$TIR). Warpage (sori) change, $\Delta$TIR (delta total indicator reading), is determined as follows.

Figure 2:
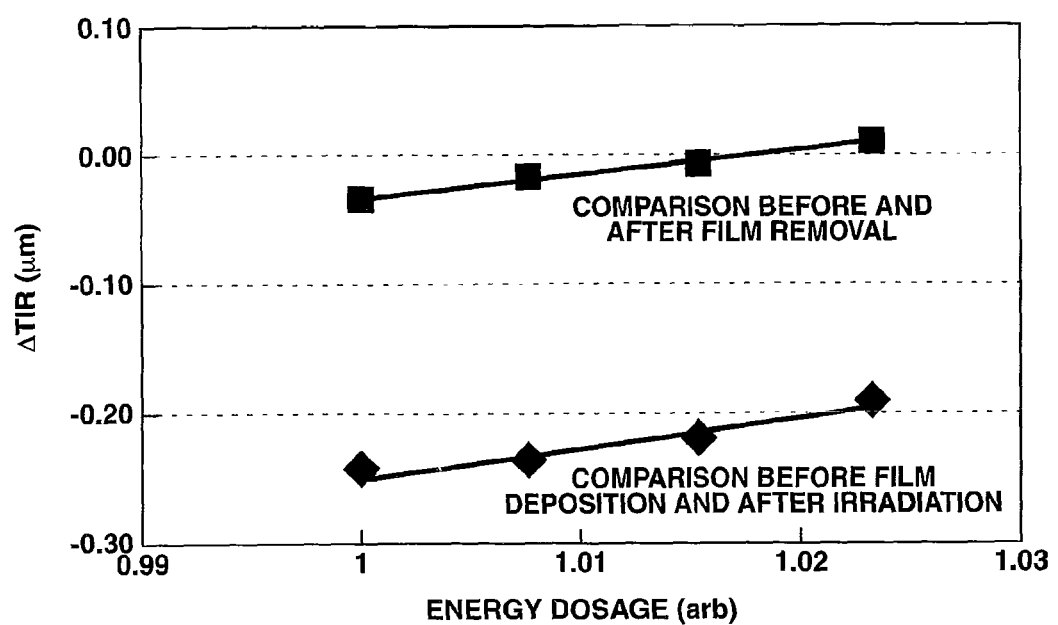
FIG. 2 is a diagram plotting warpage changes ($\Delta$TIR) in Example 1.

A surface topography of each photomask blank which underwent flash lamp irradiation after deposition of a halftone phase shift film was measured by an optical surface topography analyzing system Tropel UltraFlat® (Corning Tropel Corp.), obtaining surface topography data (coordinates). The data were compared with the data of previous measurement of the surface topography of the corresponding substrate prior to deposition of a halftone phase shift film in accordance with the steps (1) to (5), to compute a warpage change ($\Delta$TIR). It is assumed that a positive value of $\Delta$TIR is deformation by tensile stress. In FIG. 2, the warpage change ($\Delta$TIR) that the surface topography of each photomask blank after irradiation possesses relative to the surface topography of the corresponding substrate prior to deposition of a phase shift film is plotted versus the irradiation dosage.

Removal of Phase Shift Film

From the photomask blanks having a phase shift film which had undergone shape adjustment by irradiation with a flash lamp in different energy dosages, the phase shift film was removed by dry etching with fluorine etchant gas.

RF1 (RIE): CW 54 V
RF2 (ICP): CW 325 W
Pressure: 5 mTorr
$SF_6$: 18 sccm
$O_2$: 45 sccm Comparison of Surface Topography after Removal of Phase Shift Film A surface topography of the treated substrate after removal of the phase shift film by dry etching was measured by an optical surface topography analyzing system Tropel UltraFlat® (Corning Tropel Corp.), obtaining surface topography data. The data are similarly compared with the surface topography data of the photomask blank having undergone flash lamp irradiation after deposition of the halftone phase shift film, to compute a warpage change ($\Delta$TIR). This warpage change ($\Delta$TIR) versus the irradiation dosage is also plotted in FIG. 2.

It is presumed by extrapolation of plots in FIG. 2 that the substrate shape prior to deposition of a phase shift film is completely resumed by irradiation of high-energy radiation when an energy dosage of about 1.108 is irradiated. However, the value of $\Delta$TIR resulting from removal of phase shift film after substrate shape adjustment indicates that when the phase shift film which has been irradiated in such an energy dosage is removed, the surface topography changes before and after removal of the phase shift film.

It is also seen from the plots in FIG. 2 that the value of $\Delta$TIR after removal of phase shift film has a possibility of linear approximation to the dosage of energy radiation. It is speculated that upon irradiation in an energy dosage of about 1.017, the stress of the film irradiated with a flash lamp becomes zero (0).

Japanese Patent Application No. 2009-086185 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for inspecting a photomask blank or an intermediate thereof which is manufactured by depositing a phase shift film on a photomask-forming substrate and irradiating the phase shift film with high-energy radiation to effect substrate shape adjusting treatment, the method comprising the steps of:
    measuring a surface topography of the photomask blank or intermediate after the substrate shape adjusting treatment,
    removing the phase shift film from the photomask blank or intermediate,
    measuring a surface topography of the treated substrate after removal of the phase shift film, and
    comparing the surface topography of the photomask blank or intermediate with the surface topography of the treated substrate, thereby evaluating a warpage change before and after removal of the phase shift film, due to a stress of the phase shift film having undergone substrate shape adjusting treatment.

2. The method of claim 1 wherein the high-energy radiation is emission of a flash lamp.

3. A method for inspecting a plurality of photomask blanks or intermediates thereof, each said photomask blank or intermediate thereof comprising a photomask-forming substrate and a phase shift film deposited thereon and subjected to substrate shape adjusting treatment by irradiation of high-energy radiation, the method comprising the steps of:
    manufacturing a plurality of photomask blanks or intermediates by depositing a phase shift film on a photomask-forming substrate under predetermined conditions and effecting substrate shape adjusting treatment under predetermined conditions,
    taking a sample photomask blank or intermediate out of the plurality of photomask blanks or intermediates, evaluating a warpage change of the sample photomask blank or intermediate before and after removal of the phase shift film, due to a stress of the phase shift film having undergone substrate shape adjusting treatment, in accordance with the inspection method of claim 1, and
    judging the plurality of photomask blanks or intermediates to be acceptable or unacceptable based on the warpage change thus evaluated.

4. In connection with a photomask blank or an intermediate thereof which is manufactured by depositing a phase shift film on a photomask-forming substrate and irradiating the phase shift film with high-energy radiation to effect substrate shape adjusting treatment,
    a method for determining a dosage of high-energy radiation for substrate shape adjusting treatment, comprising the steps of:
    preparing two or more photomask blanks or intermediates by depositing a phase shift film on a substrate under predetermined conditions and irradiating the phase shift film with different dosages of high-energy radiation,
    evaluating a warpage change of each photomask blank or intermediate before and after removal of the phase shift film, due to a stress of the phase shift film having undergone substrate shape adjusting treatment, in accordance with the inspection method of claim 1, and
    comparing the warpage changes of the two or more photomask blanks or intermediates, thereby determining the dosage of high-energy radiation that provides a less warpage change.

5. A method for manufacturing a photomask blank, comprising the steps of depositing a phase shift film on a photomask-forming substrate and irradiating the phase shift film with high-energy radiation to effect substrate shape adjusting treatment,
    the substrate shape adjusting treatment being effected by irradiating the phase shift film with high-energy radiation in a dosage that is determined by the method of claim 4.

* * * * *